United States Patent [19]
Ogura et al.

[11] Patent Number: 5,093,875
[45] Date of Patent: Mar. 3, 1992

[54] OPTICAL INTERCONNECTION APPARATUS

[75] Inventors: Ichiro Ogura; Yoshiharu Tashiro; Kenichi Kasahara; Shigeru Kawai, all of Tokyo, Japan

[73] Assignee: NEC Corporation, Tokyo, Japan

[21] Appl. No.: 578,973

[22] Filed: Sep. 7, 1990

[30] Foreign Application Priority Data

Sep. 7, 1989 [JP] Japan .................. 1-230438

[51] Int. Cl.⁵ .................. G02B 6/36; G02B 6/00
[52] U.S. Cl. .................................................. 385/17
[58] Field of Search ............. 350/96.10, 96.14–96.16, 350/96.20–96.21

[56] References Cited

U.S. PATENT DOCUMENTS

| | | | |
|---|---|---|---|
| 4,227,260 | 10/1980 | Vojvodich et al. | 350/96.16 X |
| 4,545,077 | 10/1985 | Drapala et al. | 350/96.16 X |
| 4,799,749 | 1/1989 | Borner et al. | 350/96.13 |
| 4,915,486 | 4/1990 | Hansen | 350/96.15 X |

OTHER PUBLICATIONS

"A New Double Heterostructure Optoelectronic Switching Device Using Molecular Beam Epitaxy" by Taylor et al., J. Appl. Phys, 59(2), 15 Jan. 1986, pp. 596–600.

"Double Heterostructure Optoelectronic Switch as a Dynamic Memory with Low-Power Consumption" by Kasahara et al., Appl. Phys. Lett., vol. 52, No. 9, 29 Feb. 1988.

Primary Examiner—Akm Ullah
Attorney, Agent, or Firm—Sughrue, Mion, Zinn, Macpeak & Seas

[57] ABSTRACT

A matrix of optical functional devices are divided into plural device units. Each of the device units includes at least two optical functional devices having light transmitting coatings. The coatings have transmission factors which are different from each other. Light signals emitted through the coatings from the at least two optical functional devices in each unit are received by a corresponding light receiving device among light receiving devices arranged in a one-dimensional pattern. In each device unit optical functional devices to be driven are selected, so that a coupling degree between each device unit and the corresponding light receiving device is changed.

8 Claims, 5 Drawing Sheets

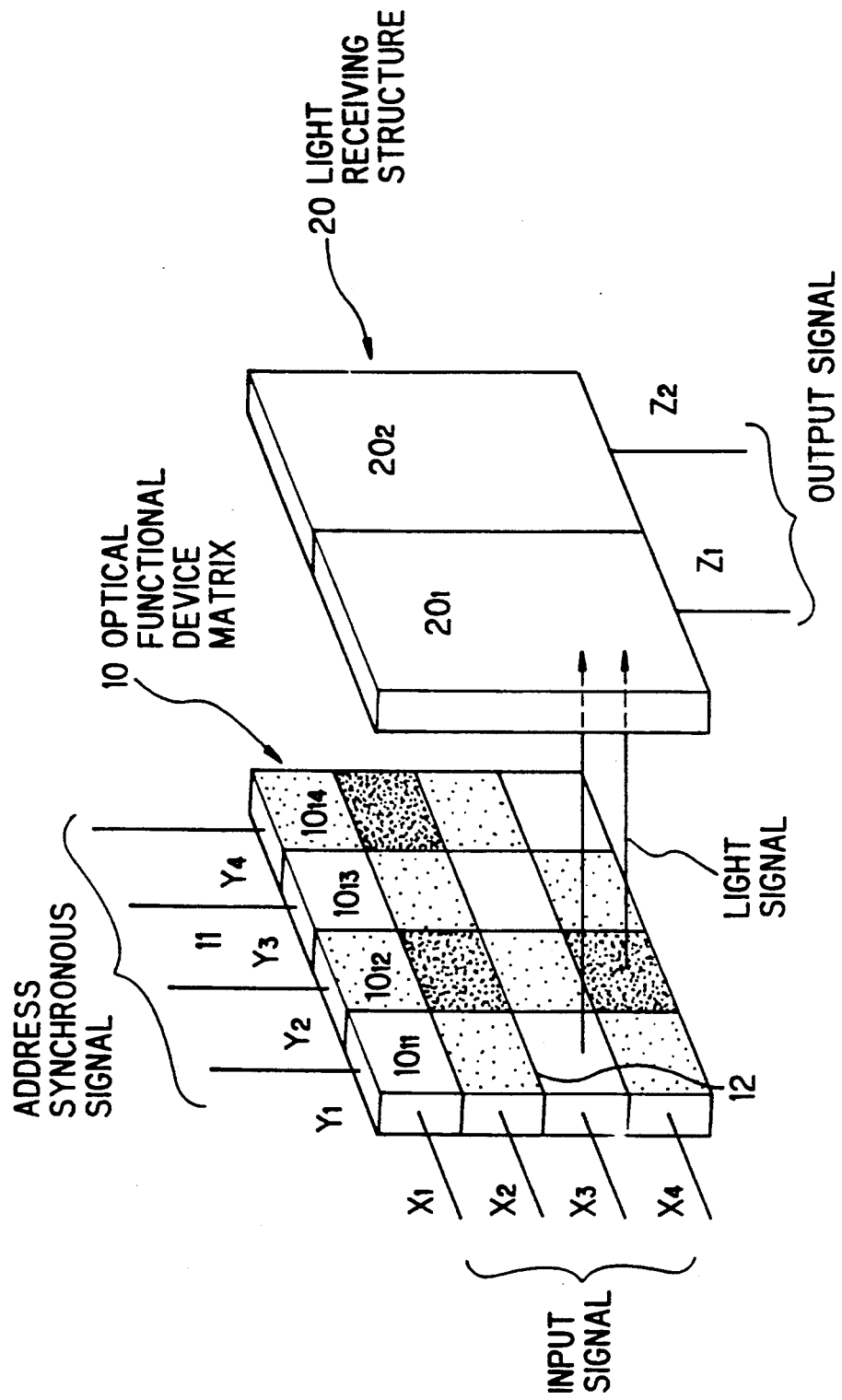

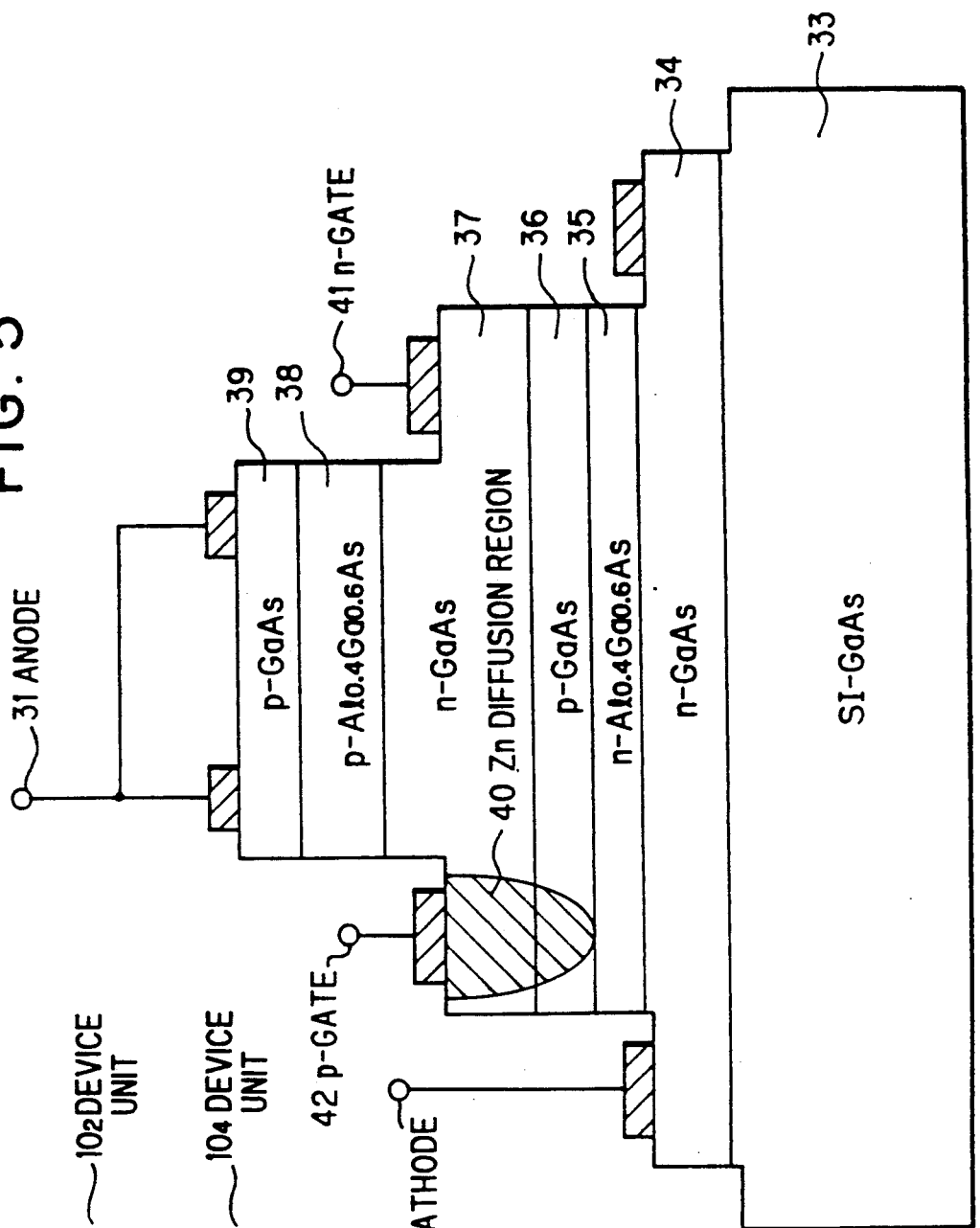
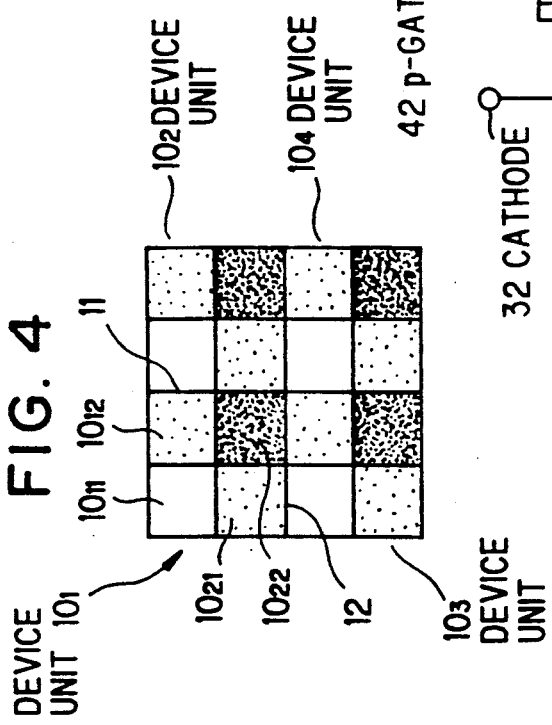

OPTICAL INTERCONNECTION APPARATUS

FIELD OF THE INVENTION

This invention relates to an optical interconnection apparatus, and more particularly to, an optical interconnection apparatus using a matrix of optical funtionable devices.

BACKGROUND OF THE INVENTION

In these days, optical input and output apparatus, optical transmission apparatus, optical switching apparatus, optical signal processing apparatus, etc. having a high signal capacity and a property of high speed are required for practical uses, since the information society has become highly advanced. In this point, a computer consisting of electronic circuits has a limitation. Therefore, an optical computer using the high speed of light and the parallel property thereof is expected to be developed. On the other hand, a neural network using optical interconnection is intensively studied to provide a practical structure. In this neural network, unit elements each defined as a "neuron" are connected by interconnections, so that an output signal is obtained from input signals by changing coupling degrees among neurons. That is, all of input signals are added to provide a sum which is compared with a threshold value to provide an output signal.

At the present stage, one type of a neural network is structured by integrated electronic devices. In this neural network, an interconnecting portion of the electronic devices may be replaced by optical devices. Another type of neural network is structured totally by optical functional devices. In any structure, an extremely large number of interconnections must be done to provide a large scaled neural network. In this point, light provides effective means for interconnections among neurons of a neural network, because the spatial transmission of information can be carried out by use of light, and a high density of interconnections can be realized due to no mutual interference of light signals.

In an optical neural network, spatial light modulating devices must be provided to change a coupling degree for each interconnection. For this purpose, liquid crystal displays are only used in the optical neural network. However, the liquid crystal displays have a disadvantage in that an operating speed is ordinarily as slow as several m sec., so that a high speed operation can not be realized. Otherwise, such devices as using non-linear materials or semiconductors are utilized as optical processing devices having high operating speeds in the optical neural network. However, these devices have a disadvantage in that the high density formation of a device arrangement is difficult to be realized, and because a technology for arranging the devices in a predetermined pattern is not sufficiently developed, and electric power consumption is large.

In this situation, attention has been paid to an optical functional device with low electric power consumption which is based on an optical thyrister. This device has been described in a report entitled "A new double heterostructure optoelectronic switching device using molecular beam epitaxy" on pages 596 to 600 of "Journal of Applied Physics, Vol. 59, No. 2, 1986", and in a report entitled "Double heterostructure optoelectronic switch as a dynamic memory with low-power consumption" on pages 679 to 681 of "Applied Physics Letter, Vol. 52, No. 9, 29 February, 1988".

Arbitrary connections using optical interconnections having a large number of parallel connections which have been carried out by input signals are realized by using functions of light emission, light response, and information storage of the above described optical functional device.

Here, an optical interconnection apparatus using a matrix of optical functional devices will be explained, as described in a paper "3a-ZA-2" on page 795 of "Extended abstracts, The 36th Spring Meeting, 1989, The Japan Society of Applied Physics and Related Societies, No. 3" held on April 1 to 4 of 1989. This optical interconnection apparatus comprises a matrix of optical functional devices and a light receiving structure. The matrix includes NXN optical functional devices arranged in a matrix pattern, and the light receiving structure includes N light receiving devices arranged in a one-dimensional pattern to face the NXN optical functional devices. In this optical interconnection apparatus, arbitrary optical interconnection are realized by driving predetermined optical functional devices which are selected from the NXN optical functional devices by applying predetermined signals to signal lines selected from N X-axis lines and N Y-axis lines. In this operation, each optical functional device has an ON state and OFF state corresponding to binary code states of "0" and "1", so that the optical functional devices operate as spatial light modulators. Thus, spatial light modulated signals are supplied to the light receiving devices. This optical interconnection apparatus has an advantage in that it operates with a speed much higher than that of an optical interconnection apparatus using liquid crystal displays.

However, this optical interconnection apparatus has a disadvantage in that coupling degrees are only set in the connection of information by the binary values of "0" and "1". Considering that this optical interconnection apparatus is applied to an optical neural network, an optical arithmetic and calculating apparatus, etc., it is desired that coupling degrees change continuously between "0" and "1".

SUMMARY OF THE INVENTION

Accordingly, it is an object of this invention to provide an optical interconnection apparatus which operates with a high speed.

It is another object of this invention to provide an optical interconnection apparatus, in which arbitrary optical interconnections can be realized.

It is a further object of this invention to provide an optical interconnection apparatus, in which coupling degrees of light information can be changed continuously between "0" and "1".

According to this invention, an optical interconnection apparatus, comprises:
 a matrix of optical functional devices each having at least first and second driving terminals, the first driving terminals being connected to a common electrode in each row of the matrix, and the second driving terminals being connected to a common electrode in each column; and
 a light receiving structure of light receiving devices arranged in a one-dimensional pattern, the light receiving devices receiving light signals emitted from the optical functional devices;

wherein the matrix of the optical functional devices are divided into plural device units each including at least two optical functional devices in the matrix and being optically coupled to a corresponding one of the light receiving devices; and the at least two optical functional devices have light transmitting coatings each having a transmission factor different from others.

In this invention, optical fuctionable devices with low electric power consumption which are based on optical thyristors are arranged in a two-dimensional pattern to provide a light emitting matrix. Driving terminals of the same kind for each device are connected to a signal line in each column and each row by use of common electrodes, so that interconnections of a matrix pattern are obtained. Each device has functions of light emission, threshold, and information storage, and is set into ON state by the application of a voltage larger than a threshold value across two terminals thereof. This ON state is held by the application of a holding voltage smaller than the turning-on voltage across the two terminals. The device which is under ON state emits light by the application of a predetermined additional voltage across the two terminals. This light emission is not obtained in devices which are not under ON state. Accordingly, if the devices which are arranged in a matrix pattern are sequentially addressed to be selectively turned on, light emission is obtained from the selected devices by applying a predetermined signal voltage thereto. The emitted lights are supplied to light receiving devices which are arranged in a one-dimensional pattern, so that signals can be transmitted to designated destinations.

In particular, optical functional devices which are arranged in a matrix pattern are divided into plural sets of optical functional devices. Here, each set is defined to be a device unit, in which each device is provided with a coating having a predetermined transmission factor different from the others. As a result, when devices are selected to emit light in the device unit, a coupling degree can be changed by changing light signal intensity. For instance, it is assumed that first, second, third, and fourth devices of the device unit are provided with no coating, and first to third coatings of supplying output lights of $\frac{1}{2}$ intensity, $\frac{1}{4}$ intensity and $\frac{1}{8}$ intensity relative to the intensity of the output light in case of no coating, respectively. The first to fourth devices are addressed to be selectively turned on in accordance with a coupling degree, and a predetermined signal voltage is commonly applied to the selected devices among the first to fourth devices. Consequently, coupling degrees of sixteen ($2^4$) steps are obtained by changing the selection of the four devices at the time of addressing. When the device unit includes n optical functional devices in number, coupling degrees of $2^n$ steps can be obtained.

BRIEF DESCRIPTION OF THE DRAWINGS

This invention will be explained in conjunction with appended drawings, wherein:

FIG. 3 is a schematic perspective view showing a matrix of optical functional devices and a light receiving structure in the preferred embodiment;

FIG. 4 is a plan view showing coatings provided on the matrix of the optical functional devices in the preferred embodiment;

FIG. 5 is a schematic cross-sectional view showing an optical functional device used in the preferred embodiment.

DESCRIPTION OF THE PREFERRED EMBODIMENTS

Figure 1:
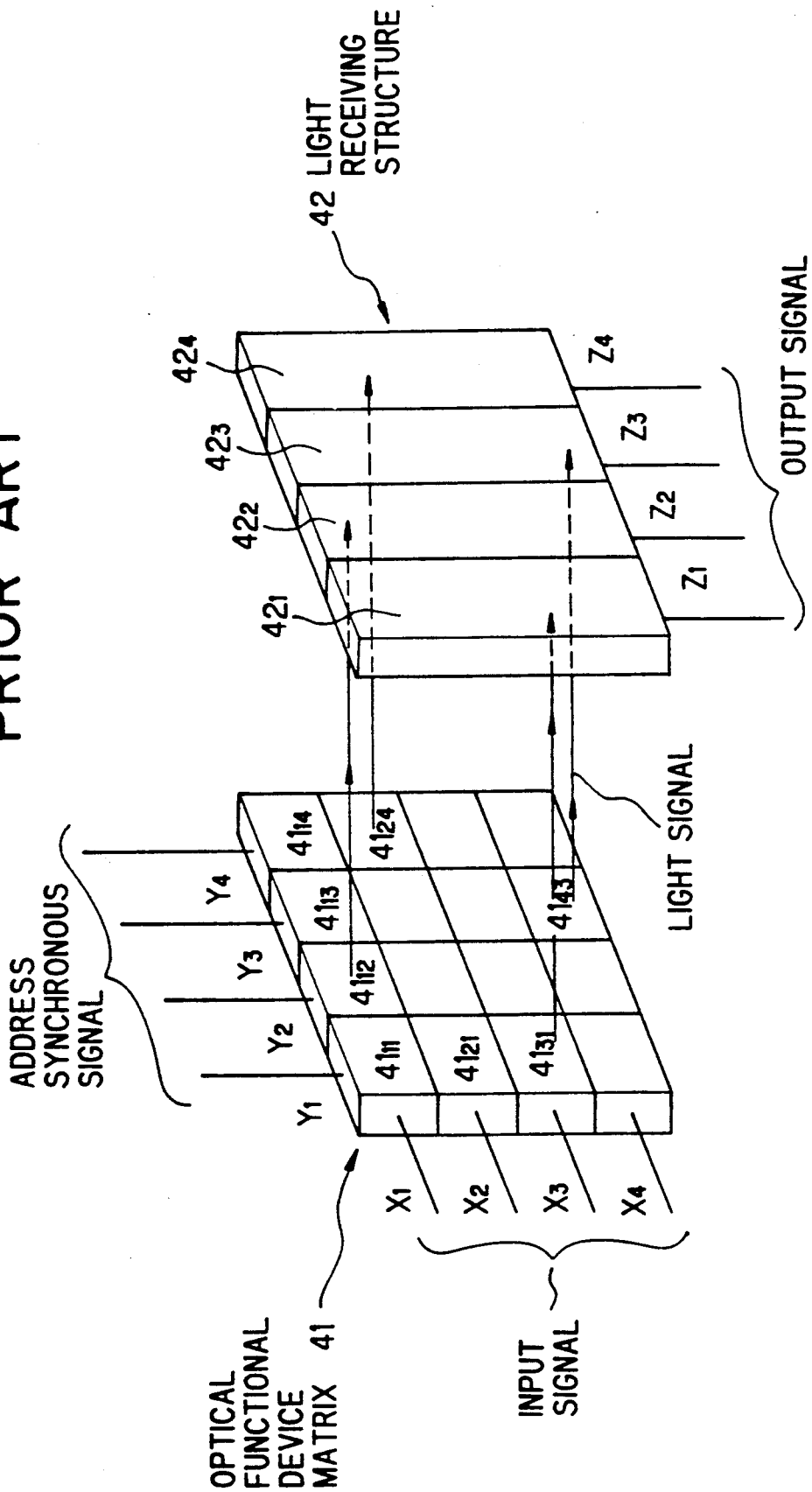
FIG. 1 is a schematic perspective view showing a conventional optical interconnection apparatus.

Before explaining an optical interconnection apparatus in the preferred embodiment according to the invention, the conventional optical interconnection apparatus will be explained in FIG. 1.

This conventional optical interconnection apparatus comprises a matrix 41 of NXN optical functional devices $41_{11}$, $41_{12}$, $41_{13}$, $41_{14}$, . . . , and a light receiving structure 42 of light receiving devices $42_1$, $42_2$, $42_3$ and $42_4$ arranged in a one-dimensional pattern to face the matrix 41, where the number N is four. In the matrix 41, the optical functional devices $41_{11}$, $41_{12}$, $41_{13}$, $41_{14}$, . . . are connected to signal lines $X_1$, $X_2$, $X_3$ and $X_4$ for input signals by each column, and to signal lines $Y_1$, $Y_2$, $Y_3$ and $Y_4$ for address synchronous signals by each row. The light receiving devices $42_1$, $42_2$, $42_3$ and $42_4$ are connected to signal lines $Z_1$, $Z_2$, $Z_3$ and $Z_4$ for output signals in the light receiving structure 42, respectively.

In operation, address synchronous signals are sequentially applied to each row of the optical functional devices $41_{11}$, $41_{12}$, $41_{13}$, $41_{14}$, . . . by the signal lines $Y_1$, $Y_2$, $Y_3$ and $Y_4$, while destination address signals are selectively applied to each column thereof in synchronism with the address synchronous signal by the signal lines $X_1$, $X_2$, $X_3$ and $X_4$. If it is assumed that the four optical functional devices $41_{12}$, $41_{24}$, $41_{31}$ and $41_{43}$ are selectively turned on, light emission is obtained from the selected devices, when information signals are applied thereto at predetermined timings. Light signals thus obtained are received by the light receiving devices $42_1$, $42_2$, $42_3$ and $42_4$ of the light receiving structure 42, as illustrated by dotted arrows in FIG. 1. Then, output signals are supplied through the signal lines $Z_1$, $Z_2$, $Z_3$ and $Z_4$ to a following signal processing stage.

However, this conventional optical interconnection apparatus has the disadvantage as explained before, although it is not repeatedly described here.

Figure 2:
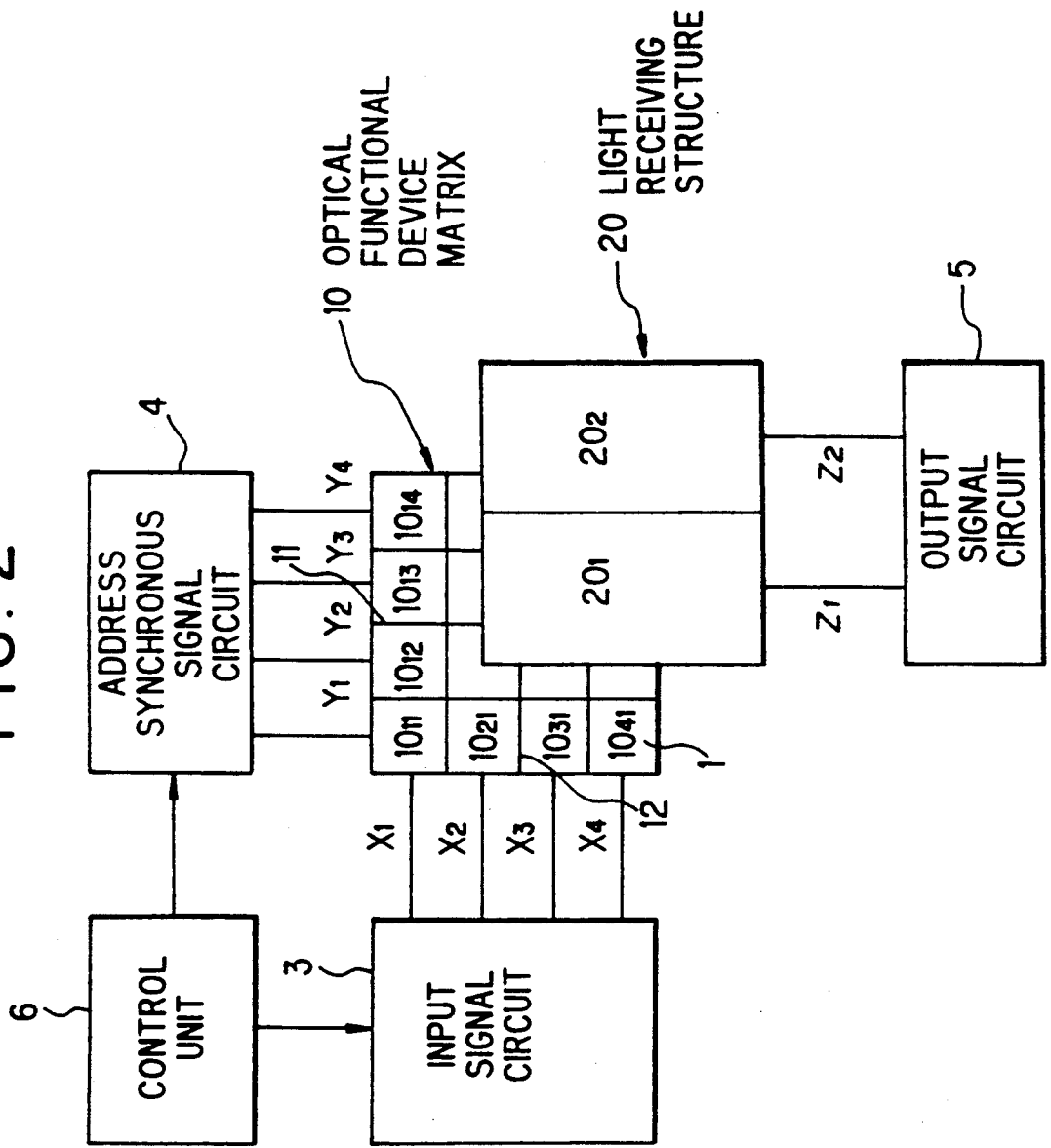
FIG. 2 is a block diagram showing an optical interconnection apparatus in a preferred embodiment according to the invention.

An optical interconnection apparatus in the preferred embodiment will be explained in FIGS. 2 to 4.

This optical interconnection apparatus comprises a matrix 10 of 4×4 optical functional devices $10_{11}$, $10_{12}$, $10_{13}$, $10_{14}$ . . . which are arranged in a two-dimensional pattern, and a light receiving structure 20 of light receiving devices $20_1$ and $20_2$ which are arranged in a one-dimensional pattern to face a light emitting surface of the matrix 10. The matrix 10 is connected through matrix signal lines $X_1$, $X_2$, $X_3$ and $X_4$ to an input signal circuit 3, from which destination address signals for designating destinations of information signals, and information signals to be transmitted to the designated destinations are sequentially supplied to selected optical functional devices of the matrix 10, and is connected through matrix signal lines $Y_1$, $Y_2$, $Y_3$ and $Y_4$ to an address synchronous signal circuit 4, from which address synchronous signals are sequentially supplied to the matrix 10 by each row. The light receiving devices $20_1$ and $20_2$ of the light receiving structure 20 are connected through output signal lines $Z_1$ and $Z_2$ to an output signal circuit 5, in which output signals supplied from the light receiving structure 20 are processed. The input signal circuit 3, the address synchronous signal circuit 4, etc. are controlled by a control unit 6.

The matrix 10 is divided into four device units $10_1$, $10_2$, $10_3$ and $10_4$ by vertical and horizontal lines 11 and 12, as shown clearly in FIG. 4. Each of the four device units $10_1$, $10_2$, $10_3$ and $10_4$ includes 2×2 optical functional devices. For instance, the device unit $10_1$ includes the optical functional device $10_{11}$ having no coating, and the optical functional devices $10_{12}$, $10_{21}$ and $10_{22}$ having coatings of transmission factors for supplying output lights having intensities of $\frac{1}{2}$, $\frac{1}{4}$ and $\frac{1}{8}$, respectively, relative to that of an output light obtained from the optical functional device $10_{11}$. The device units $10_2$, $10_3$ and $10_4$ have the same structure as the device unit $10_1$. Therefore, coupling degrees of sixteen steps are obtained for light signals supplied from the matrix 10 to the light receiving structure 20. Such a coating is provided on an optical functional device, for instance, by evaporating a metal such as Cr, etc. thereon.

FIG. 5 shows one type of an optical functional device having a thyristor structure which is applied to the matrix 10. This optical functional device comprises epitaxial layers which are grown on a semi-insulating GaAs substrate 33 by molecular beam epitaxy. These epitaxial layers are an n-GaAs buffer layer 34, an n-$Al_{0.4}Ga_{0.6}As$ layer 35, a p-GaAs layer 36, an n-GaAs active layer 37, a p-$Al_{0.4}Ga_{0.6}As$ layer 38, and a p-GaAs layer 39. This optical functional device further comprises an anode electrode 31 provided on the p-GaAs contact layer 39, a cathode electrode 32 provided on the n-GaAs buffer layer 34, an n-gate electrode 41 provided on the n-GaAs layer 37, and a p-gate electrode 42 provided on a Zn-diffusion region 40 provided through the n-GaAs layer 37 into the p-GaAs layer 36. This optical functional device is a device having properties of a threshold value and light emission, and is turned on to shift into an operating state by the application of a voltage equal to or higher than the threshold value across the anode and cathode electrodes 31 and 32 thereof. This operating state is held by applying a voltage equal to or higher than a holding voltage across the anode and cathode electrodes 31 and 32. In this operating state, the functional device emits light by the application of a predetermined voltage lower than the threshold voltage and higher than the holding voltage thereto. Otherwise, an optical functional device which is not turned on due to no application of the threshold voltage thereto does not emit light, even if the predetermined voltage is applied across the anode and cathode electrodes 31 and 32 thereof. The optical functional device which is under the operating state is controlled to return to a nonoperating state by the application of a voltage lower than the holding voltage. This optical functional device is of a response speed as high as several hundred MHz. The n and p gate electrodes 41 and 42 function as electron and hole extractors to achieve high-speed turn-off.

Figure 6:
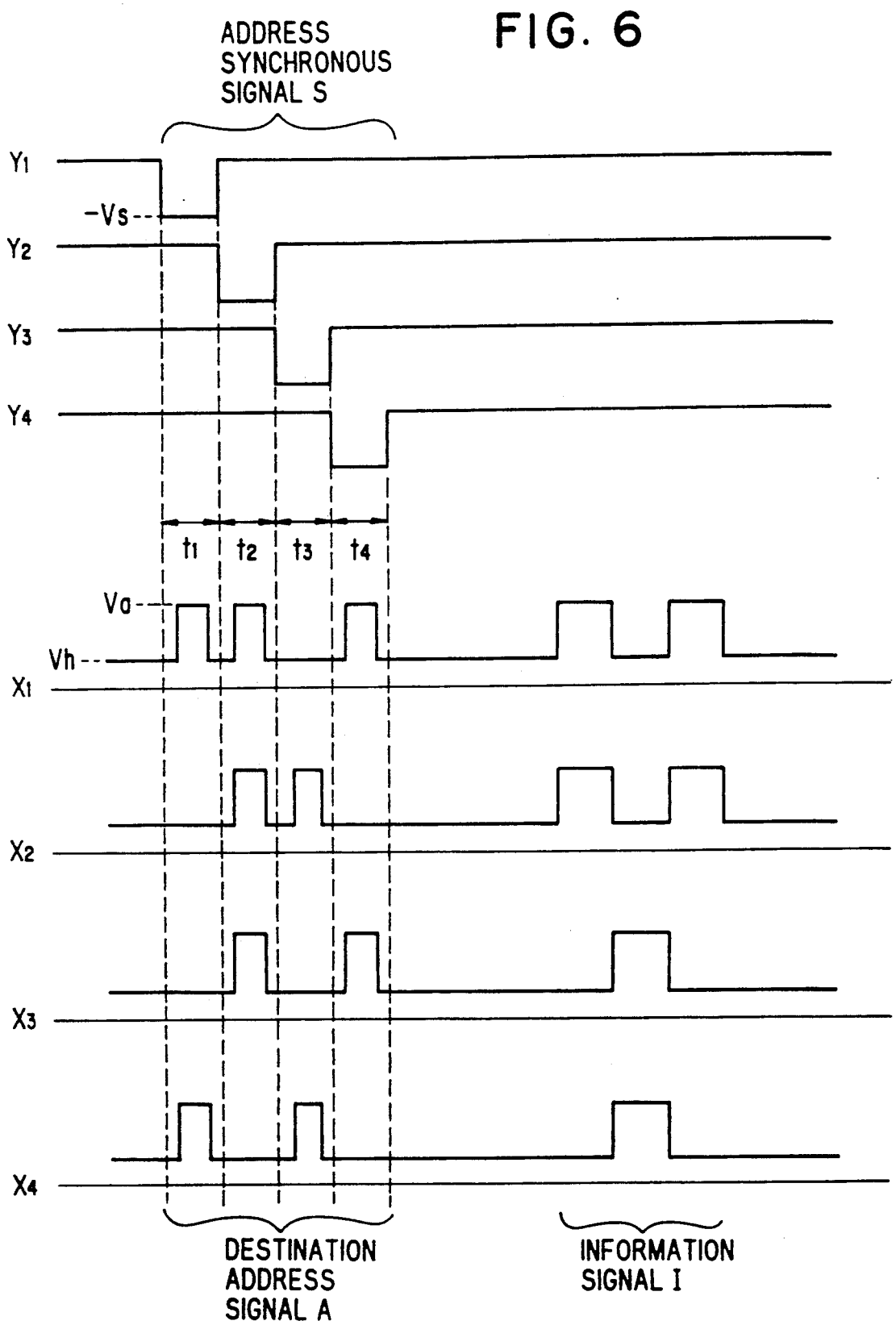
FIG. 6 is a timing chart showing operation in the preferred embodiment.

In operation, the address synchronous signals S are supplied from the address synchronous signal circuit 4 to the matrix signal lines $Y_1$, $Y_2$, $Y_3$ and $Y_4$, and the destination address signals A and information signals I are supplied from the input signal circuit 3 to the matrix signal lines $X_1$, $X_2$, $X_3$ and $X_4$, as shown in FIG. 6. The address synchronous signals S are of a pulse voltage $-Vs$, and are applied through the matrix signal lines $Y_1$, $Y_2$, $Y_3$ and $Y_4$ to the matrix 10 in time-division as shown by $t_1$, $t_2$, $t_3$ and $t_4$. On the other hand, the destination address signals A are of a pulse voltage Va larger than a holding voltage Vh, and are applied to selected signal lines among the matrix signal lines $X_1$, $X_2$, $X_3$ and $X_4$ corresponding to selected optical functional devices in each row of the matrix 10 at each time division $t_1$, $t_2$, $t_3$ or $t_4$.

At the divisional time $t_1$, for instance, a voltage (Va+Vs) obtained by adding the voltage Vs of the address synchronous signal S and the voltage Va of the destination address signal A is applied to the optical functional devices $10_{11}$ and $10_{41}$. This voltage (Va+Vs) is set to be larger than a threshold voltage Vth which is ordinarily 2 to 5 V, so that the optical functional devices $10_{11}$ and $10_{41}$ are turned on to shift into the operating state. At the divisional times $t_2$, $t_3$ and $t_4$, the optical functional devices $10_{12}$, $10_{22}$ and $10_{32}$, $10_{23}$ and $10_{33}$, and $10_{14}$ and $10_{34}$ are turned on to shift into the operating state, respectively, as apparent from the timing chart of FIG. 6. This operating state is held in the optical functional devices thus turned on by the application of a holding voltage of approximately 1.4 V thereto.

In this circumstance, the information signals I are applied through the matrix signal lines $X_1$, $X_2$, $X_3$ and $X_4$ to the optical functional devices of the matrix 10 in a signal line selected mode at timings as shown in FIG. 6. Thus, light signals are emitted from the optical functional devices which are under the operating state. More precisely, the information signals I are applied to the matrix signal lines $X_1$ and $X_2$ simultaneously, and to the matrix signal lines $X_3$ and $X_4$ simultaneously. As a result, the optical functional devices $10_{11}$, $10_{12}$ and $10_{22}$ emit light signals which are modulated by the respective transmission factors in the device unit $10_1$ of the matrix 10. These light signals thus modulated are received by the light receiving device $20_1$ of the light receiving structure 20, so that the sum of the light signals are obtained therein to be supplied through the output signal line $Z_1$ to the output signal processing circuit 5. At the same time, the optical functional devices $10_{14}$ and $10_{23}$ emit modulated light signals in the device unit $10_2$ of the matrix 10. These modulated light signals are received by the light receiving device $20_2$ of the light receiving structure 20, so that the sum of the light signals are obtained therein to be supplied through the output signal line $Z_2$ to the output signal processing circuit 5. In the same manner, modulated light signals emitted from the device units $10_3$ and $10_4$ of the matrix are received by the light receiving devices $20_1$ and $20_2$ of the light receiving structure 20, respectively.

As described above, two inputs are connected to two outputs by the changeable coupling degrees, so that an optical interconnection apparatus having the load-sum function to provide an output signal generated by adding inputs is obtained. As a matter of course, when it is required that the steps of coupling degrees are increased in number, the number of optical functional devices included in device units of a matrix is increased.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. In an optical interconnection apparatus, the improvement comprising:

a matrix of optical functional devices each having at least first and second driving terminals, said first driving terminals being connected to a common electrode in each row of said matrix, and said second driving terminals being connected to a common electrode in each column; and receiving devices arranged in a one-dimensional pattern, said light receiving devices receiving light signals emitted from said optical functional devices;

wherein said matrix of said optical functional devices are divided into plural device units each including at least two optical functional devices in said matrix and being optically coupled to a corresponding one of said light receiving devices; and said at least two optical functional devices have light transmitting coatings each having a transmission factor different from others.

2. In an optical interconnection apparatus, according to claim 1, the improvement further comprising:

a control unit for controlling said at least two optical functional devices in each device unit to be turned on and then emit light signals, whereby said at least two optical functional devices are turned on in time-division, and emit said light signals simultaneously.

3. An optical interconnection apparatus, comprising a matrix of optical devices, each of which includes an anode and a cathode, each of said anodes being connected to a common electrode in each row of said matrix, and each of said cathodes being connected to a common electrode in each column of said matrix; and light receiving devices arranged in a one-dimensional pattern, said light receiving devices receiving signal emitted from said optical devices;

wherein said matrix of said optical devices is divided into multiple units, each of which includes at least two optical devices, said units being optically coupled to corresponding light receiving devices, said optical devices being controlled such that any combination of optical devices within a unit simultaneously illuminate a single light receiving device.

4. An optical interconnection apparatus, as in claim 3, wherein said matrix constitutes a 4 by 4 matrix of optical devices and each of said units includes a 2 by 2 matrix of optical devices, wherein at least two optical devices in each unit simultaneously transmit different levels of light intensity onto a single light receiving unit.

5. An optical interconnection apparatus, as in claim 3, wherein said receiving devices includes first and second devices, each of which receives more than two levels of light intensity from each unit.

6. An optical interconnection apparatus, comprising:

a matrix of optical devices, each of which is connected to a common row electrode and a common column electrode, said matrix of said optical devices being divided into units, each of said units including at least to optical devices, and a plurality of receiving devices arranged in a one-dimensional pattern, each receiving device being optically coupled to a corresponding unit, wherein each unit is controllable to transmit more than two levels of light intensity to a corresponding one of said receiving devices.

7. An optical interconnection apparatus as in claim 6, wherein a designated level of light intensity is transmitted to a single light receiving device by simultaneously turning on a plurality of said optical devices.

8. An optical interconnection apparatus as in 6, wherein at least two optical devices within a unit include a light transmissive coating thereon, such that said at least two optical devices transmit different levels of light intensity when turned on.

* * * * *

UNITED STATES PATENT AND TRADEMARK OFFICE
CERTIFICATE OF CORRECTION

PATENT NO.   :   5,093,875
DATED        :   March 3, 1992
INVENTOR(S)  :   Ichiro OGURA, Yoshiharu TASHIRO,
                 Kenichi KASAHARA and Shigeru KAWAI It is certified that error appears in the above-identified patent and that said Letters Patent is hereby corrected as shown below:

Col. 7, line 27, after "comprising" insert --:--

Col. 8, line 22, delete "to" and insert --two--.

Signed and Sealed this

First Day of June, 1993

Attest:

MICHAEL K. KIRK

Attesting Officer          Acting Commissioner of Patents and Trademarks